US00RE36782E

United States Patent [19]

Brown et al.

[11] E Patent Number: Re. 36,782

[45] Reissued Date of Patent: Jul. 18, 2000

[54] MAGNET ASSEMBLY FOR USE IN NMR APPARATUS

[75] Inventors: Ian J. Brown; John M. Bird; Ian L. McDougall; David Black, all of Oxon, United Kingdom

[73] Assignee: Oxford Medical Limited, Oxford, United Kingdom

[21] Appl. No.: 08/668,318

[22] Filed: Jun. 26, 1996

Related U.S. Patent Documents

Reissue of:

[64] Patent No.: 4,587,504
Issued: May 6, 1986
Appl. No.: 07/669,311
Filed: Nov. 7, 1984

U.S. Applications:

[63] Continuation of application No. 07/336,235, Apr. 11, 1989, abandoned.

[30] Foreign Application Priority Data

Nov. 11, 1983 [GB] United Kingdom ..... 8330198
Nov. 11, 1984 [GB] United Kingdom ..... 8400684

[51] Int. Cl.[7] ..... H01F 7/22

[52] U.S. Cl. ..... 335/216

[58] Field of Search ..... 335/214, 216, 335/301, 320; 324/318–322; 315/85; 336/84 R, 84 C, 84 M, 170, 171, 181, 185

[56] References Cited

U.S. PATENT DOCUMENTS 2,156,079 4/1939 Beggs .
3,199,021 8/1965 Anderson .
3,210,610 10/1965 Fraser .

(List continued on next page.)

FOREIGN PATENT DOCUMENTS 0 067 933 B1 2/1985 European Pat. Off. .
0 138 270 A2 4/1985 European Pat. Off. .
0 138 270 B1 4/1985 European Pat. Off. .
1416691 11/1964 France .
2146071 9/1971 Germany .
26 46 467 10/1976 Germany .
29 51 018 12/1979 Germany .
3123493 6/1981 Germany .
52-90293 1/1976 Japan .
8303533 1/1984 Netherlands .
1285694 11/1969 United Kingdom .
2070254 1/1981 United Kingdom .
2070254A 9/1981 United Kingdom .
2 156 079 10/1985 United Kingdom .

OTHER PUBLICATIONS

Martin N. Wilson, "Superconducting Magnets", Clarendon Press, Oxford, 1983, Chapter 9, Section 9.8.

Teruo Noguchi, "High Homogenious Field Superconducting Magnet", Sep. 1, 1976, pp. 241–251, vol. 11, No. 6 No translation.

Peter Burglund and Matti Savelainen, "A Superconducting Magnet For Whole Body NMR–Imaging", pp. 673–676.

Katsumi Kose et al., "NMR–CT Scanner", 1983, pp. 669–676.

(List continued on next page.)

*Primary Examiner*—Louis Arana
*Attorney, Agent, or Firm*—Staas & Halsey LLP

[57] ABSTRACT

A magnet assembly (1) particularly for use in NMR apparatus comprises a first superconducting coil assembly (A,A'–C,C') for generating a first magnetic field; and a second superconducting coil assembly (D–F) for generating a second magnetic field. The second superconducting coil assembly (D–F) is electrically connected in series with the first superconducting coil assembly (A,A'–C,C'). Each coil assembly (A,A'–C,C'; D–F) generates magnetic fields where corresponding components are of substantially the same order of magnitude whereby a resultant, uniform magnetic field is generated in a working volume (3). The second magnetic field opposes the first magnetic field externally of the magnet assembly (1).

18 Claims, 6 Drawing Sheets

U.S. PATENT DOCUMENTS

| | | | |
|---|---|---|---|
| 3,256,464 | 6/1966 | Stauffer . | |
| 3,265,939 | 8/1966 | Rinderer . | |
| 3,283,277 | 11/1966 | Hulm et al. . | |
| 3,287,630 | 11/1966 | Gang . | |
| 3,333,162 | 7/1967 | Arbuthnot . | |
| 3,394,330 | 7/1968 | Schindler . | |
| 3,406,333 | 10/1968 | Nelson . | |
| 3,419,904 | 12/1968 | Weaver et al. . | |
| 3,450,952 | 6/1969 | Nelson . | |
| 3,469,180 | 9/1969 | Anderson . | |
| 3,495,162 | 2/1970 | Nelson . | |
| 3,564,398 | 2/1971 | Nelson . | |
| 3,566,255 | 2/1971 | Jaynes . | |
| 3,577,067 | 5/1971 | Weaver . | |
| 3,671,902 | 6/1972 | Westendorp . | |
| 3,818,396 | 6/1974 | Raphael . | |
| 4,021,726 | 5/1977 | Garroway et al. . | |
| 4,038,622 | 7/1977 | Purcell . | |
| 4,231,008 | 10/1980 | Krueger . | |
| 4,310,799 | 1/1982 | Hutchison et al. . | |
| 4,362,993 | 12/1982 | Young et al. . | |
| 4,385,277 | 5/1983 | Hanley . | |
| 4,398,149 | 8/1983 | Zens . | |
| 4,398,167 | 8/1983 | Dickie et al. | 335/272 |
| 4,409,579 | 10/1983 | Clem et al. . | |
| 4,456,881 | 6/1984 | Compton . | |
| 4,484,814 | 11/1984 | Kawaguchi et al. . | |
| 4,490,675 | 12/1984 | Knuettel et al. . | |
| 4,509,011 | 4/1985 | Sugimoto et al. . | |
| 4,509,030 | 4/1985 | Vermilyea . | |
| 4,595,899 | 6/1986 | Smith et al. . | |
| 4,612,505 | 9/1986 | Zijlstra . | |
| 4,617,516 | 10/1986 | Schenck . | |
| 4,621,236 | 11/1986 | Halbach . | |
| 4,623,864 | 11/1986 | Inoue et al. . | |
| 4,639,672 | 1/1987 | Beaumont . | |
| 4,646,024 | 2/1987 | Schenck et al. . | |
| 4,701,736 | 10/1987 | McDougall et al. . | |
| 4,724,412 | 2/1988 | Kalafala . | |
| 4,737,716 | 4/1988 | Roemer et al. . | |
| 5,539,367 | 7/1996 | Xu et al. | 335/301 |
| B1 4,737,716 | 1/1989 | Roemer et al. . | |

OTHER PUBLICATIONS

Chapters 6 and 8 of "NMR Imaging In Biomedicine" by Mansfield and Morris, 1982.

"Nuclear Magnetic Resonance Imaging in Medicine and Biology", Peter G. Morris, OMT data (acknowledged Feb. 1984) for conventional MRI magnets quoted in Morris (OUP, 1986).

Ballou and Moses, IEE Transactions on Magnetics,, vol. MAG–11, No. 2, Mar. 1975, pp. 497–499.

"possible"—Webster's New Collegiate Dictionary, 1973.

Solid–State Devices Manual, 1975, RCA Corp., pp. 242–243.

Solenoid Magnet Design, "The Magnetic and Mechanical Aspects of Resistive and Superconducting Systems", Bruce Montgomery, 1969 pp. 1–311.

Leon Kaufman et al, "Resonance Imaging In Medicine", Igaku–Shoin, 1981 4 pages.

Peter G. Morris, "Nuclear Magnetic Resonance Imaging in Medicine and Biology", Department of Biochemistry, University of Cambridge, pp. 189–215, 253–255, 1986.

Milan Wayne Garrettt, "Thick Cylindrical Coil Systems For Strong Magnetic Fields With Field or Gradient Homogeneities of the 6th to 20th Order", Journal of Applied Physics, vol. 38, No. 6, May 1967, pp. 2563–2586.

Milan Wayne Garrett, "Axially Symmetric Systems for Generating and Measuring Magnetic Fields Part I", Journal of Applied Physics, vol. 22, No. 9, Sep. 1951, pp. 1091–1107.

Charles E. Roos, "Superconducting Magnets", pp. 115–127, Section 9 of text by C.L. Partain et al., Nuclear Magnetic Resonance Imaging, W.B. Saunders, 1983.

K.A. Muething, D.O. Edwards, J.D. Edwards, J.D. Feder, W.J. Gully, and H.N. Scholz, "Small solenoid with a superconducting shield for nuclear magnetic resonance near 1mK", Rev. Sci. Instrum. 53(4), Apr. 1982, American Institute of Physics, pp. 485–490.

A. Echarri, M. Sacchetti & M. Spadoni, "Comments on Minimum Volume Simple and Compensated Superconducting Coils", The Review of Scientific Instruments, vol. 42, No. 6, Jun. 1971, pp. 801–805.

B. Girard et M. Sauzade, "Calcul Des Solenoides Compenses Due 6$^{eme}$ Ordre A Volume De Bobinage Minimum", Nuclear Instruments And Methods 25, 1964, pp. 269–284.

"Gyroscan T5—Breakthrough in MR Performance", Philips Medical Systems 11 pages.

J.K. Ballou et al., "External Field Reduction of Superconducting Energy Storage Solenoids", *IEEE Transactions on Magnets*, vol. MAG–11, No. 2, Mar. 1975, pp. 497–499.

J.E.C. Williams et al., Magnet system of the 500 MHz NMR spectrometer at the Francis Bitter National Magnet Laboratory: 1. Design and development of the magnet, *Rev. Sci. Instrum*, 52(5), May 1981, pp. 649–656.

Herve Saint–Jalmes and Jacques Taquin, "Systems: Application to whole–body NMR imaging magnets", *Rev. Sci. Instrum*, 52(10), Oct. 1981, pp. 1501–1508.

David Coffey et al., "The 11.7 T Solenoid of the Hyperon Bubble Chamber", Nuclear Instruments and Methods 150 (1978), pp. 377–385.

A.J. Stevens et al., "Quench Protection Studies On CBA Magnets" *IEEE Transactions on Nuclear Science*, vol. NS–30, No. 4, Aug. 1983, pp. 3369–3371.

K.E. Robins, et al., "Superconducting Magnet Quench Protection For Isabelle", *IEEE Transactions on Nuclear Science*, vol. NS–24 No. 3, Jun. 1977, pp. 1318–1319.

J.E.C. Williams, "Aspects of the Design of NMR Magnets For Analysis And Imaging", pp. 667–672, *Proceedings of the Ninth International Cryogenic Engineering Conference*, Kobe, Japan May 11–14 1982.

Herve Saint–Jalmes and Jacques Taquin, "Optimization of homogeneous electromagnetic coil systems: Application to whole–body NMR imaging magnets", *Rev. Sci. Instrum 52*(10), Oct. 1981, pp. 1501–1508.

Charles E Roos, Howard T. Coffeey, Kenneth R. Efferson, "Superconducting Magnets" *Technology And Systems Engineering*, pp. 115–127.

K.J. Best and B. Rothe, "A multiple purpose 7TNbTi split coil superconducting magnet system for Mossbauer spectroscopy and susceptibility measurements at various temperatures".

David Coffey, "The 11.7T Solenoid Of The Hyperon Bubble Chamber" *2107 Nuclear Instruments & Methods* vol. 150, No. 3, (Apr. 1978) pp. 377–385.

MAGNET ASSEMBLY FOR USE IN NMR APPARATUS

Matter enclosed in heavy brackets [ ] appears in the original patent but forms no part of this reissue specification; matter printed in italics indicates the additions made by reissue.

*This application is a continuation of application Ser. No. 07/336,235, filed Apr. 11, 1989 now abandoned and a Reissue of U.S. Pat. No. 4,587,504 on May 6, 1986.*

The invention relates to a magnet assembly and particularly to a magnet assembly suitable for use in nuclear magnetic resonance (NMR) imaging.

In recent years, the technique of NMR imaging has been developed to enable parts of the human body to be imaged. NMR relies on the property of certain atoms in the body to resonate (by processing) at a particular frequency when exposed to a strong magnetic field. By imposing mutually orthogonal magnetic gradients across the body spatial discrimination can be obtained. An example of NMR apparatus is described in U.S. Pat. No. 4,021,726.

In order to carry out these NMR imaging techniques, it is necessary to provide a high strength, uniform magnetic field within a working volume *having both radial and axial dimensions* usually defined by the bore of the magnet. A typical field strength for the bore magnetic field is 2.0 T. *A typical uniformity is on the order of about at least 400 to normally better than about 100 parts per million or about 0.04% to better than 0.01%.* One of the problems with conventional magnet assemblies for generating such a field is that a large external magnetic field is generated at the same time which is potentially hazardous. It is therefore desirable to shield the magnet assembly to limit this external field.

Currently, external magnetic fields are contained by using iron shielding either forming part of the magnet assembly, or within a room housing the magnet assembly such as by placement of iron sheets on the walls of the room.

Iron shielding is cumbersome and expensive. For example, in order to prevent the external magnetic field exceeding 5.0 Gauss beyond a radius of 5 meters requires 3 tons of iron for a magnet assembly generating a 1.5 kG bore field, while up to 40 tons of iron is required to shield a magnet assembly generating a 20 kG bore field. Clearly, the engineering required to support such large amounts of iron is expensive and furthermore the nearer the iron is to the magnet assembly, the more the bore field itself can be distorted. This is particularly undesirable in the case of magnet assemblies used for NMR imaging where a closely controlled uniform bore field is essential.

An alternative method for shielding magnets has been to juxtapose coils of wire around the magnet as for example shown in U.S. Pat. No. 3,671,902. In this case, however, the coils used to shield the magnet have produced small, local magnetic fields and this requires complex calculations to determine the field at a particular radius and then to design a coil to provide a suitable shielding field. Furthermore, this prior art arrangement is designed to shield magnets which produce comparatively low strength bore fields in contrast to the field strength with which the present invention is concerned. A further problem for which the prior art does not provide a solution is that it is commonly necessary, particularly with NMR imaging, to change the strength of the bore magnetic field. Such a change will cause changes in the external field and this will require complex modifications to the various shielding coils. For example, it may be necessary not only to change the exciting currents passing through the shielding coils but also the number of turns and positions of the coils relatively to the magnet.

U.S. Pat. No. 3,333,162 also discloses a small scale shielding arrangement. This arrangement provides no further assistance to someone trying to solve the problems outlined above for a number of reasons. Firstly, this arrangement of coils could never be used for NMR work because of rotation of the principal field vector in the bore, therefore the device as described could not be copied or scaled up directly. Secondly the device is dealing with magnetic fields very much less than those necessary for NMR. We estimate that the bore field of the largest coil in the Hz component would be about 460 Gauss while at distances of between 20 and 30 cms the fringe field would in any case be less than the earths field. We require a magnet assembly where preferably the fringe field very close to the surface of the assembly is reduced to something of the order of magnitude of the earths field and a device which is open at the ends for patient access.

In accordance with the present invention we provide a magnet assembly comprising a first superconducting coil assembly for generating a first magnetic field; and a second superconducting coil assembly for generating a second magnetic field, the second superconducting coil assembly being electrically connected in series with the first superconducting coil assembly, wherein the first and second superconducting coil assemblies each generate, in use, magnetic fields whose corresponding components are of substantially the same order of magnitude, the assemblies being arranged such that a resultant, uniform magnetic field is generated in a working volume, and the second magnetic field opposes the first magnetic field externally of the magnet assembly.

This invention provides a self-contained magnet assembly which does not require additional external shielding devices and in addition can generate a useful (ie. high strength), uniform magnetic field in the working volume. As explained above, in the past, although shielding using coils has been proposed, these coils have produced small external magnetic fields whereas with the invention the second superconducting coil assembly not only provides a shielding field but also contributes significantly to the resultant magnetic field in the working volume. The uniformity arises by virtue of balancing to zero the higher order field terms of both coil assemblies. *Balancing of the Field terms can be performed in accordance with the computerized iterative approaches described in, for example, Axially Symmetric Systems for Generating and Measuring Magnetic Field, Part I by M. W. Garrett, Journal of Applied Physics, Vol. 22, No. 9, September 1951, pages 1091–1107; Thick Cylindrical Coil Systems for Strong Magnetic Fields With Field or Gradient Homogeneities of the 6th to 20th Order, by M. W. Garrett, Journal of Applied Physics, Vol. 38, No. 6, May 1967, pages 2563–2586; Great Britain Patent 2,070,254 by Hanley; and Solenoid Magnet Design, by Montgomery, Wiley-Interscience, New York, 1969, section 8.5 and 8.6.* In [principle, it is possible to balance] *one approach the invention balances* the first and second coil assemblies separately so that each provides a uniform field and when these two are superpositioned the result is also uniform. The resultant magnetic field in the working volume is thus due to the difference in zero order terms between the fields generated by the two coil assemblies. This leads to a considerable increase in control of the uniformity of the bore magnetic field.

A further important advantage of the invention is that the two superconducting coil assemblies are electrically connected in series. This means that when the strength of the bore magnetic field is changed by changing the current flowing through the first superconducting coil assembly the second magnetic field will automatically change by an amount sufficient so that the same degree of shielding is achieved. In other words, the shielding system is linear.

Superconducting coil assemblies are used in order to achieve the strength and the high degree of precision of magnetic field which is required for NMR imaging. The superconductive condition of the coils is achieved by cooling the coils to very low temperatures of the order of 4.2 K. using conventional cryogenic or refridgeration techniques. The coils are preferably operated in persistent mode in or to avoid field noise.

We have found that the overall size of our new magnet assembly including the cooling apparatus, is only a little greater than for a conventional unshielded magnet.

The self-shielded or self-contained magnet assembly is particularly advantageous in enabling substantial site arrangement and installation costs to be avoided. Furthermore, the shield constituted by the second superconducting coil assembly can be designed and constructed with great accuracy and will not reduce the uniformity of the magnetic field in the working volume. Indeed, the shield field contributes to the control of magnetic field in the working volume. In addition, more shielding is possible than would be practicable with the conventional iron containment methods.

Normally, the direction of electrical current through the second superconducting coil assembly will be opposite to the current direction in the first superconducting coil assembly.

In the simplest form of magnet assembly according to the invention, the first and second coil assemblies each comprise a single coil, the two coils being electrically connected in series.

Preferably, one or both of the first and second coil assemblies comprises a plurality of coaxial coils arranged symmetrically about a mid-plane of the magnet assembly normal to the coil axis.

One of the problems with using two superconducting coil assemblies is that considerable stresses are developed in use. These stresses can be considerably reduced by placing the second superconducting coil assembly in such a way that the field values within the coil windings are generally as for an unscreened magnet. Then the operating forces in the windings are increased only by the increased current necessary to provide the net magnetic field within the working volume.

Typically, where both the first and second assemblies comprise pluralities of coils the two axes and the two mid-planes will be coincident. This makes it particularly straight forward to obtain uniformity of the resultant magnetic field in the working volume (ie. the bore of the assembly). In addition the coils of the second superconducting coil assembly will have a larger internal radius than the external radius of the coils of the first superconducting coil assembly. A special feature of using concentric coils is that [it is possible to balance] orders between the first coil assembly (magnet) and the second coil assembly (shield) *are balanced* so that, if considered independently, the magnet and the shield would not provide uniform fields and the uniformity is only achieved when the two are operated together.

In one example, the first and second superconducting coil assemblies each comprise six superconducting coils, the coils constituting the first superconducting coil assembly being arranged radially inwardly of the coils constituting the second superconducting coil assembly, and all the coils being arranged coaxially and symmetrically about a common mid-plane normal to the coil axis.

The degree of shielding particularly in the axial direction achieved by the magnet assembly described will normally be sufficient for normal practical purposes. In some cases, however, it may be convenient additionally to provide a further shield of magnetic material arranged around at least the first superconducting coil assembly. In particular this will reduce further the radial fringe field. For example this further shield could be positioned around the second superconducting coil assembly or preferably between the first and second coil assemblies. Preferably the further shield is provided adjacent to the coil or coils of the second superconducting oil assembly. This may most conveniently be achieved by constructing a former supporting the second superconducting coil assembly as the further shield.

Conveniently, the further shield is made of iron. This can enable the amount of expensive superconductor in the second coil assembly to be reduced. We believe that a significant reduction can be achieved by using only 6000 kg of iron for a 1.5 T bore field.

Further shielding may be achieved, if necessary, by providing additional coil assemblies positioned adjacent to each end of the working volume, the further coil assemblies being arranged to oppose the resultant magnetic field generated by the first and second superconducting coil assemblies at these positions. These further coil assemblies will normally be resistive coils since the field required is relatively small. This also allows the diameters of the coils to be made large without requiring a large cryostat. The further coils could, however, be superconducting and in this case they could be electrically connected in series with the first and second superconducting coil assemblies.

Some examples of magnet assemblies according to the invention and of NMR apparatus incorporating such magnet assemblies will now be described with reference to the accompanying drawings, in which.

Figure 1:
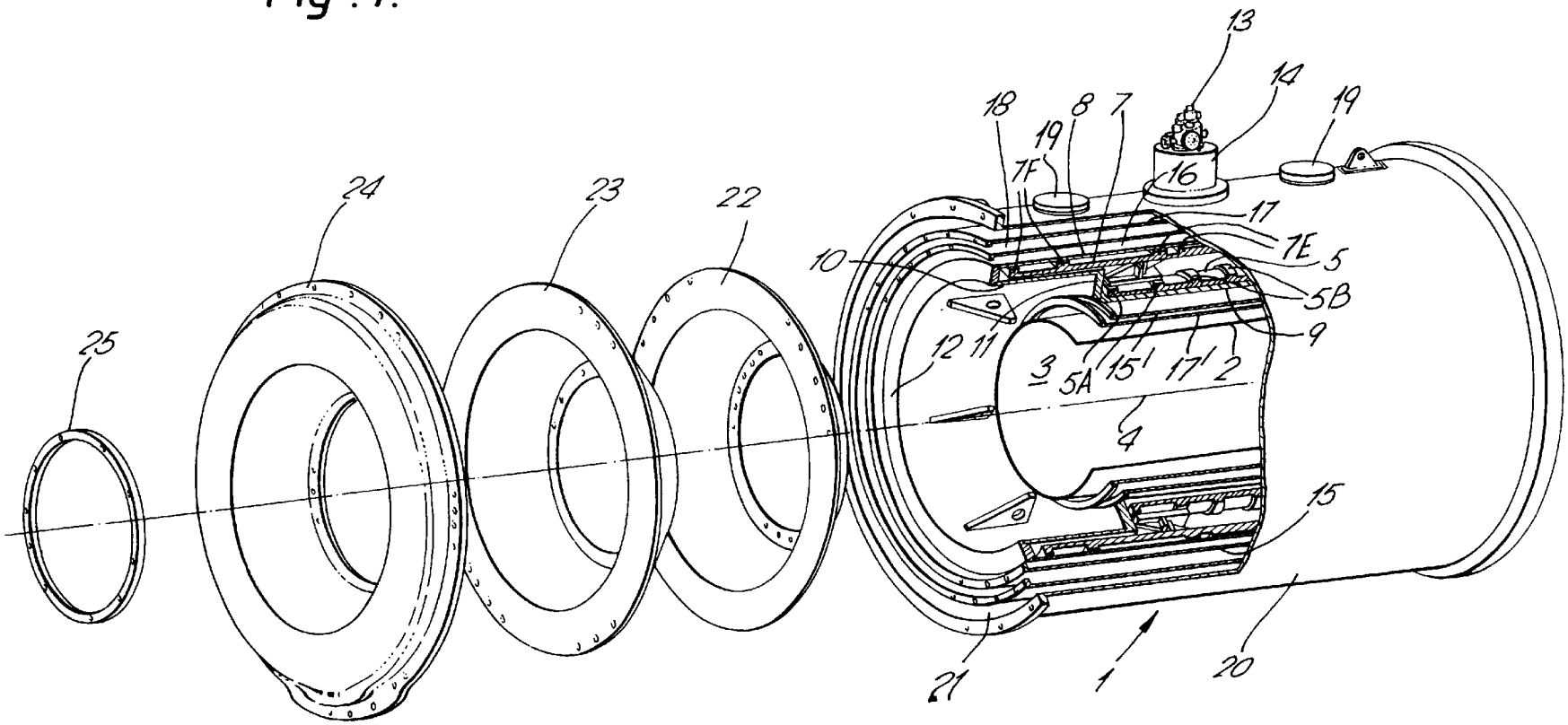
FIG. 1 is an exploded, partly cut away perspective view of one example of a magnet assembly.
Figure 2:
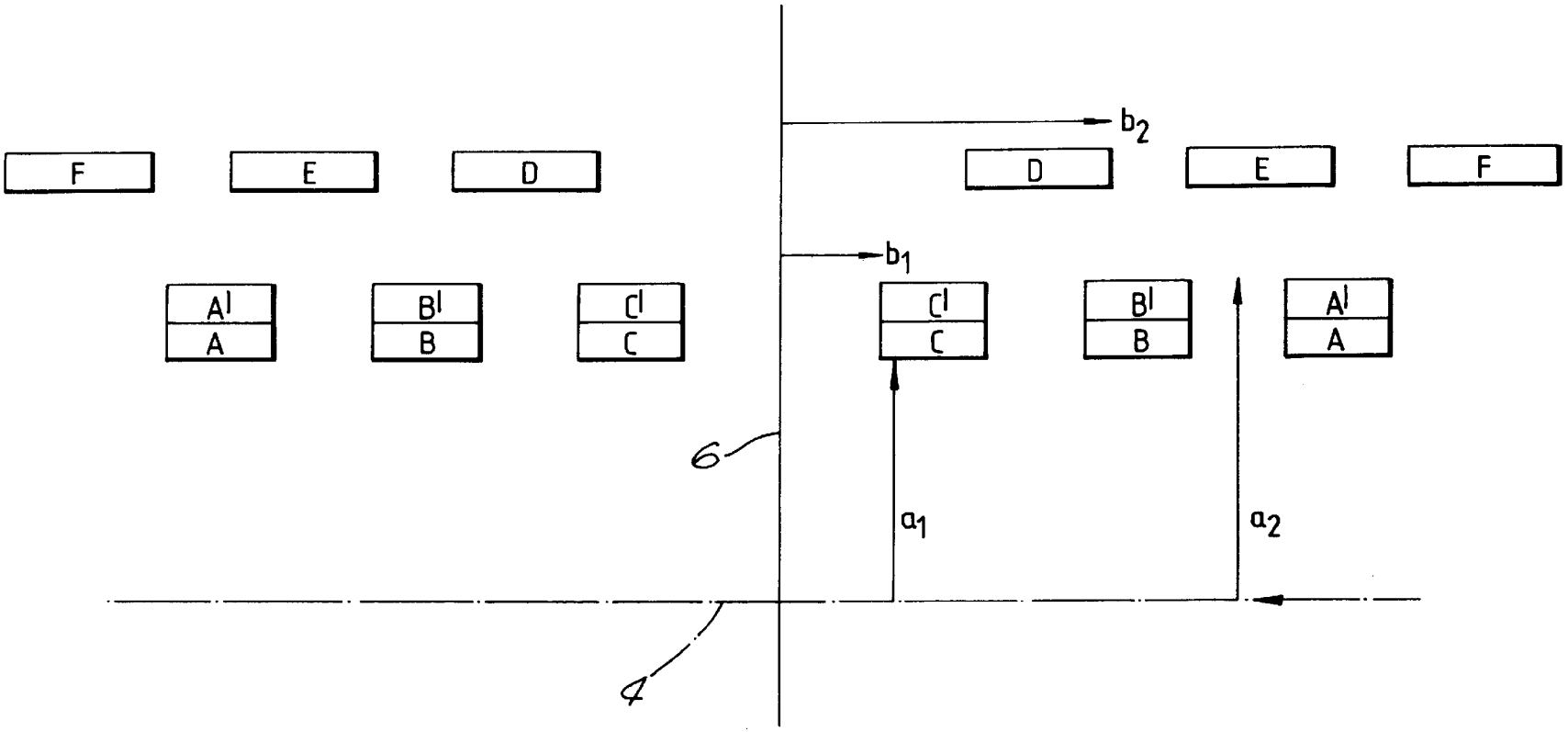
FIG. 2 illustrates graphically the positions of the superconducting coils of the magnet assembly shown in FIG. 1.

FIG. 1 illustrates in exploded and partly cut away form a magnet assembly 1. The magnet assembly 1 comprises an inner, cylindrical former 2 made of a glass fibre epoxy composite defining the working volume of the magnet assembly constituted by a bore 3 having an axis 4. Positioned radially outwardly of the former 2 is a cylindrical, aluminium former 5 coaxial with the axis 4. The former 5 carries three pairs of coils A,A'–C,C' arranged symmetrically about a mid-plane 6 of the assembly normal to the axis 4 (FIG. 2). Each of the coils A–C is formed from a superconductive conducting material which typically comprises fine strands of alloy Type II superconductor, a matrix of good normal conductor in which the superconductor strands are embedded in the form of a regular array, and a surface electrical insulation to cope with energisation and fault mode voltages. The position and number of turns of each coil will be described later. Each of the pairs of coils A,A'–C,C' is wound separately, one being positioned radially inwardly of the other. The coils are embedded in a wax composition and then surrounded by a clamping ring (not shown). In addition each pair of coils is positioned between respective pairs of annular ribs 5A, 5B etc of the former 5. The purpose of the wax composition and the ribs is to prevent significant movement of the windings of the coil in use since any small movement will be accompanied by the generation of a small amount of heat leading to breakdown of the superconductive condition (known as quenching). In view of the close spacing of the coils A–C, the former 5 must be constructed to accommodate large forces between adjacent coils which, in the axial direction, can amount to some 200,000 Kg. In addition, the former 5 must be as light as possible to reduce the overall weight of the magnet assembly and be as near to a right cylinder as possible.

A second, aluminium former 7 is mounted radially outwardly of the former 5. The former 7 carries 6 shielding coils D–F (FIG. 2) arranged symmetrically about the mid-plane 6 of the magnet assembly in a manner to be described below. The coils D–F are mounted between respective pairs of ribs 7F 7E of the former 7 in a way similar to the coils A,A'–C,C'. Clamping rings (not shown) and wax are also used to reduce movement of the coil windings. The clamping rings are particularly important because counter-running currents in the two sets of coils cause very large radial forces to develop.

In order that the windings of the coils A–F can achieve their superconductive condition it is necessary to cool the windings to about 4.2 K. This is the boiling point of helium and thus the two formers 5, 7 are positioned within a helium can defined by an outer cylindrical wall 8 and an inner wall having a central cylindrical portion 9 and a pair of radially outer, cylindrical portions 10 (only one of which is visible in FIG. 1). The portions 9, 10 are integrally connected by annular web portions 11. The helium can is closed by a pair of ring members 12. The wall 8, portions 9, 10, 11 and ring members 12 are all made of stainless steel. Liquid helium is supplied to the helium can via an inlet 13 mounted in a turret 14.

Cylindrical, aluminium radiation shields 15, 15' are mounted coaxially, radially outwardly and inwardly respectively about the helium can to define an evacuated space 16 between the shields 15,15' and the helium can. The shields 15,15' are cooled by contact with helium through the agency of a heat exchanger (not shown) in the turret 14 which extracts heat from the radiation shields 15, 15' and passes it to the cold helium gas that has been boiled from the helium can.

Further aluminium radiation shields 17,17' are mounted coaxially, radially outwardly and inwardly respectively about the shields 15, 15' to define an evacuated space 18. In use, liquid nitrogen is supplied to a cooling tube (not shown) wound around the shields 17, 17' and connected to blank ports 19 of the turret 14. Finally, a cylindrical, stainless steel outer casing 20 is mounted coaxially about the shield 17 to define a vacuum space 21. Pairs of aluminium end plates 22–24 are provided to close the ends of the spaces 16, 17, 21 while a pair of end rings 25 are mounted to the inner shield 17'. Only one of each pair of plates and rings is shown in FIG. 1.

To minimise the heat load, the various shields are supported by a system of glass rods (not shown) mounted in corresponding attachment plates. These rods when configured as a three dimensional array of struts will support a 4000 kilogram magnet at the expense of a heat leak of no more than 0.04 watts.

In use, the helium can is filled with liquid helium which will be at 4.2 K. As the liquid helium boils, the gas produced will pass into the heat exchanger in the turret 14 which will cool the shields 15,15' to a temperature of about 40° K. The boiling of the liquid helium maintains the wall of the helium can at 42° K. Liquid nitrogen being present in the cooling tubes (not shown) maintains the shields 17,17' at a temperature of about 77 K. This jacket of liquid nitrogen together with the vacuum contained within the spaces 16, 18, 21 help to maintain the temperature of the helium can at 4.2 K.

The spaces 16, 18 21 are connected through valves (not shown) within the turret 14 to the atmosphere to enable the spaces to be evacuated.

The arrangement of the coils A–F may best be understood by considering the field at the center of a set of circular, coplanar coils arranged on the surface of a cylinder. This field is proportional to the radius for each ampere of current through the coils. If the bore field is $B_o$ and the field of a point outside the magnet assembly is $B_f$, then for the magnet (M) constituted by the inner coils A,A'—C,C' and the antimagnet (A) constituted by the coils D–F we have:

$$B_o^M/B_f^M=R_1$$

$$B_o^A/B_f^A=R_2$$

For complete cancellation of the external field at a given point, we require $$B_f^A = -B_f^M.$$

The total effective magnetic field in a bore due to both arrays of coils is thus:

$$B_o^M+(-B_o^A)=B_o^M(1-R_2/R_1)$$

Thus a fully screened system requires more current than an unscreened magnet assembly for a fixed bore field. The effect of this increase in current is to increase the forces to which the conductor is subject in the coil winding and this is dealt with in the manner previously described.

The radial and axial positions of the coils A–F are chosen so that the field within the bore 3 is at a selected value and is substantially uniform throughout the bore. In addition, the coil sizes and positions are such that the field strength externally of the magnet assembly does not exceed a specified value. The position of each coil A–F can be characterised by four measurements. These are indicated in FIG. 2. These comprise the inner radius $a_1$, the outer radius $a_2$, the distance parallel to the axis 4 of the nearest part of the coil from the mid-plane 6 ($b_1$) and the furthest distance from the mid-plane 6 ($b_2$). It will be appreciated from FIG. 2 that the coils A–F all have a rectangular cross-section.

Table 1 below illustrates how for coils of different diameter the bore field and fringe field changes. In each case, the coil is assumed to have 1,432,664 amp turns with a radius of a cms. The bore field is $B_0$ while the fringe field at a radius of 400 cms in the mid-plane of the coil is designated $B_r$ while the fringe field at a distance of 400 cms from the centre of the coil along the axis of the coil is designated $B^z$. The fringe fields are represented by their z components ie. the components parallel with the axis of the coils.

TABLE 1

| a cm | $B_0$ Gauss | $B^r$ Gauss | $B^z$ Gauss |
|---|---|---|---|
| 40 | 22504 | 12.89 | 21.49 |
| 50 | 17994 | 21.49 | 34.38 |
| 60 | 15000 | 31.52 | 48.71 |
| 70 | 12865 | 45.85 | 65.90 |
| 80 | 11250 | 61.61 | 84.53 |
| 90 | 10000 | 80.22 | 106.01 |
| 100 | 9001 | 104.6 | 127.5 |

An inner coil is now chosen, for example a coil with a radius of 60 cms, and an outer coil is then selected which is as close as possible radially to the inner coil but which has a slightly reduced strength so that the fringe fields match. For example, if the main magnet is taken to have a radius of 60 cms it will produce a bore field of 15,000 Gauss and a mean fringe field of 40.1 Gauss (see Table 1). A shield coil having a radius of 80 cms will by itself produce a bore field of 11,250 Gauss and a mean fringe field of 7.31 Gauss. The shield coil will be run in the opposite sense to the main coil. In order to balance the fringe fields so that they cancel it is necessary to reduce the number of amp turns in the shield coil by 40.1/73.1 ie. to 786,560 amp turns. The shield coil will thus then produce a bore field of 6176 Gauss and a mean fringe field of 40.1 Gauss. Thus, the net bore field will be 15,000–6176=8823 Gauss and a net mean fringe field of zero.

An example of the dimensions of a set of coils suitable for use with the magnet assembly shown in FIG. 1 is given in Table 2 below.

TABLE 2

| | | $a_1$ | $a_2$ | No Turns per sq cm of cross section | $b_1$ | $b_2$ | Length wire per coil pair (m) |
|---|---|---|---|---|---|---|---|
| Inner | (A) | 62.00 | 66.00 | 19.6 | 63.90 | 86.48 | 14351 |
| Coils | (A') | 66.03 | 68.73 | 34.4 | 63.90 | 86.48 | 17706 |
| | (B) | 65.50 | 66.88 | 19.2 | 24.37 | 40.97 | 3652 |
| | (B') | 66.88 | 68.63 | 34.4 | 24.37 | 40.97 | 8523 |
| | (C) | 65.76 | 67.14 | 19.2 | 3.52 | 16.60 | 2889 |
| | (C') | 67.14 | 68.73 | 34.4 | 3.52 | 16.60 | 6061 |
| Outer | D | 98.38 | 101.62 | −19.3 | 12.46 | 18.52 | 4775 |
| Coils | E | 98.38 | 101.62 | −19.3 | 46.85 | 55.03 | 6447 |
| | F | 98.38 | 101.62 | −19.3 | 104.77 | 126.91 | 17430 |

In this table, all distances apart from the length of wire are in centimeters. The minus signs before the number of turns of the coils D–F indicate that current passes through these coils in the opposite direction to that of the other coils.

This particular arrangement can produce a 2.0T bore field having a very high homogeneity and a field stability of <0.1 ppm per hour. A field of 2.0T is obtained using a current of 429 Amperes.

Figure 3:
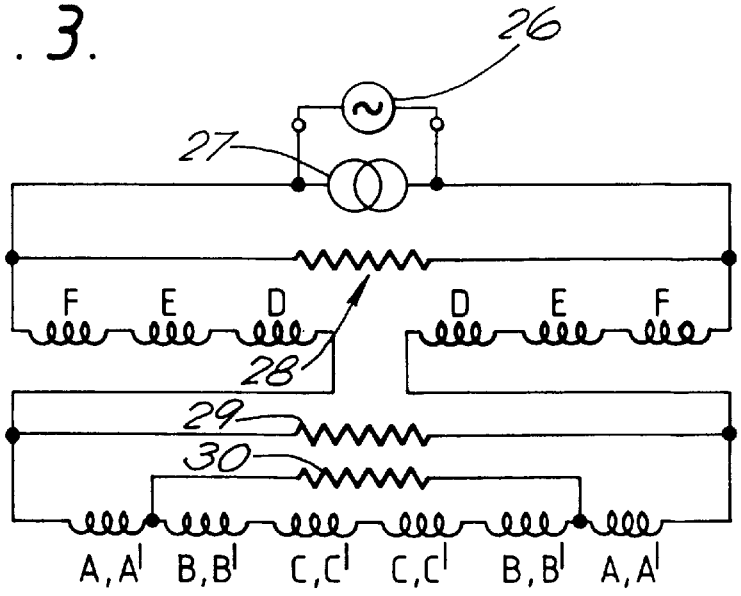
FIG. 3 is a circuit diagram illustrating the electrical connections between the superconducting coils illustrated in FIG. 2.

The electrical connections between the coils is illustrated in FIG. 3. A power supply 26 is connected via a switch 27 and a protection resistor 28 of 0.5 ohms in parallel with the coils D–F. Each set of coils D–F is connected in series with the coils A, A'–C, C'. Additional 0.5 ohm protection resistors 29, 30 are positioned in parallel with all the coils A, A'–C, C' and the coils B, B'–C, C' respectively.

Figure 4:
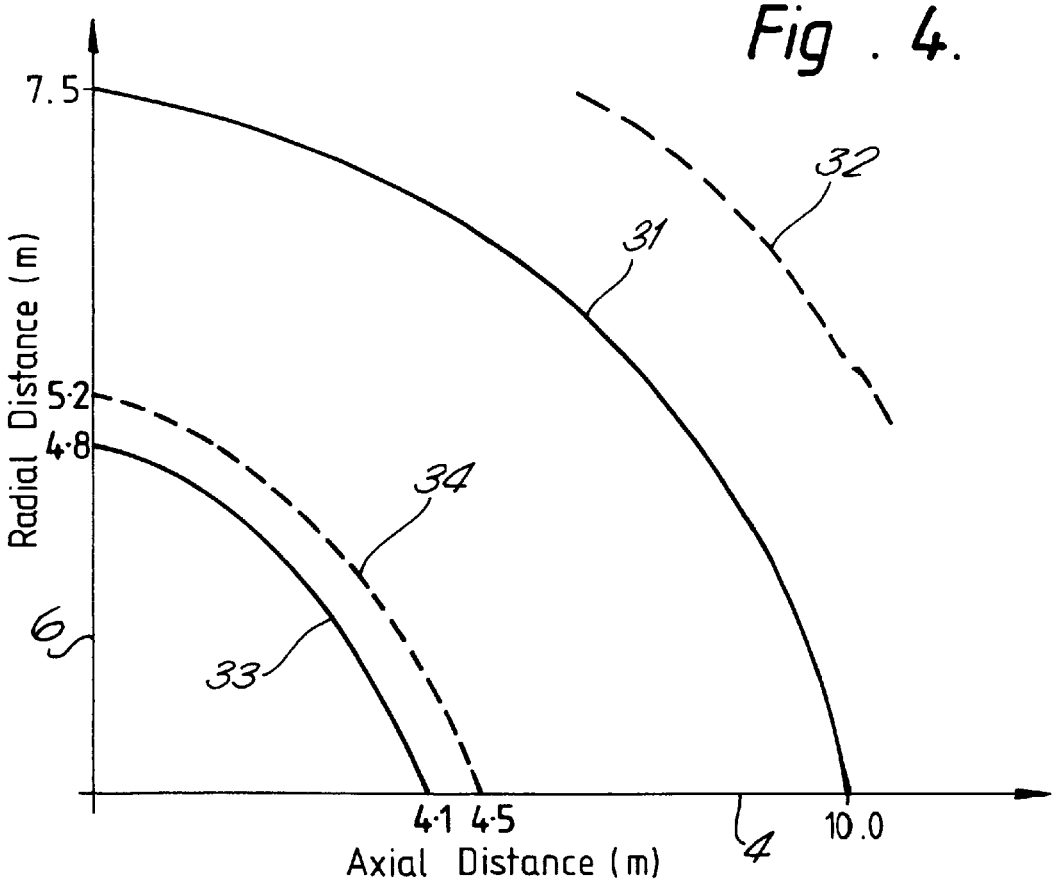
FIG. 4 illustrates the variation of field strength with distance from an origin defined by the intersection of the axis and mid-plane of the magnet assembly for both an unshielded magnet assembly and the assembly shown in FIG. 1.

The effectiveness of the outer set of coils D–F on shielding the magnet assembly can be seen from FIG. 4. With an unshielded magnet producing a bore field of 15 kG, an external field having a strength of 10G will be experienced at a distance of 10 meters from the mid-plane 6 of the magnet assembly and up to 7.5 meters from the axis 4 of the magnet assembly as is illustrated by a line 31 in FIG. 4. A dashed line 32 indicates the position where the external field strength has dropped to 5G. In contrast to this, lines 33, 34 illustrate the positions where the external field strength has dropped to 10G and 5G respectively with the magnet assembly shown in FIGS. 1 and 2.

Figure 5:
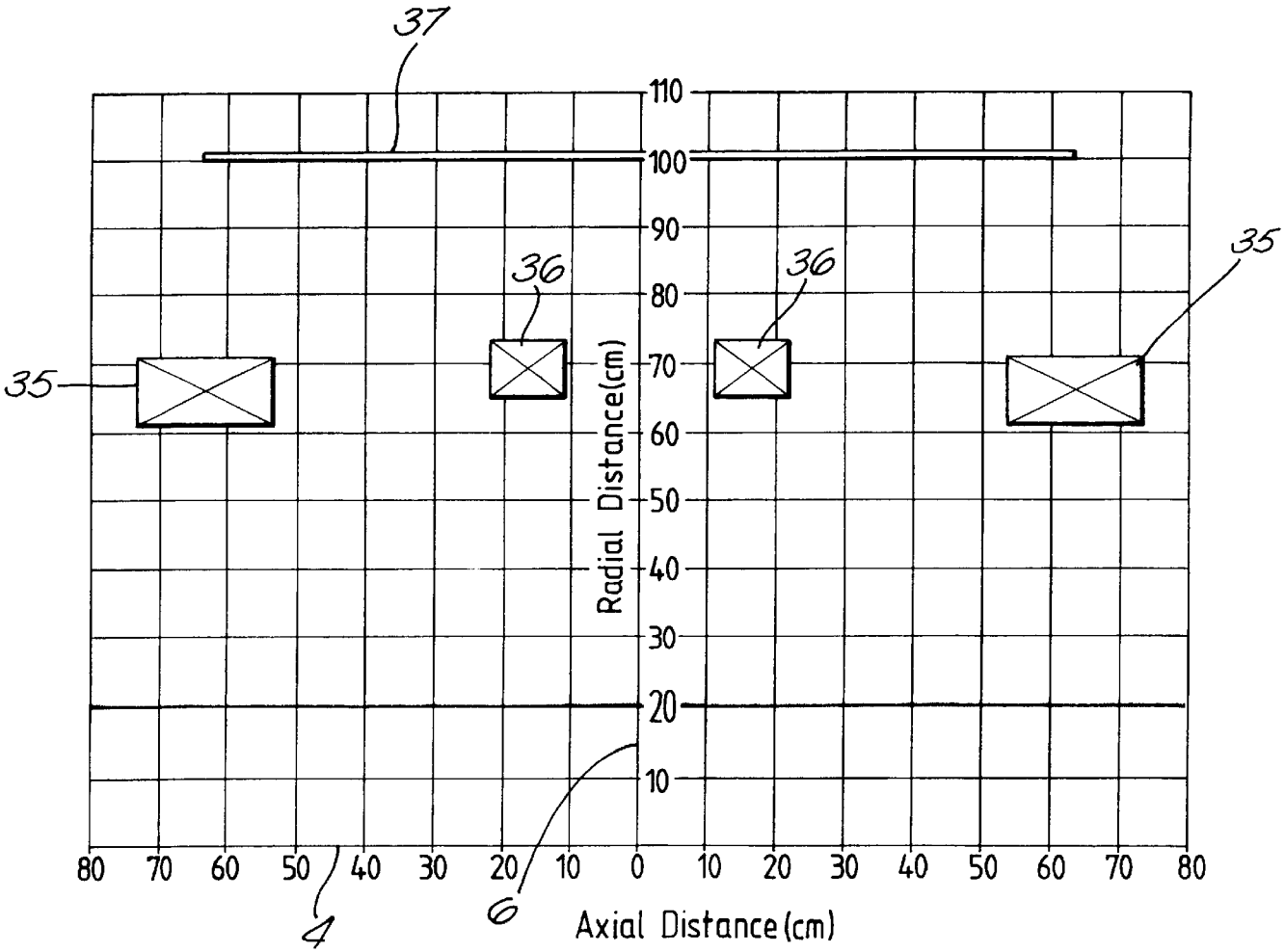
FIG. 5 illustrates the coil arrangement for a second example of a magnet assembly.

FIG. 5 illustrates an alternative coil geometry in which the inner coils A, A'–C, C' have been replaced by two pairs of coils 35, 36. Each coil 35 has 4098 turns and each coil 36 has 2000 turns. The coils D–F have been replaced by a single solenoid 37 having 4400 turns positioned 100 cms from the axis 4 and extending to 64 cms on either side of the mid-plane 6.

Figure 6A:
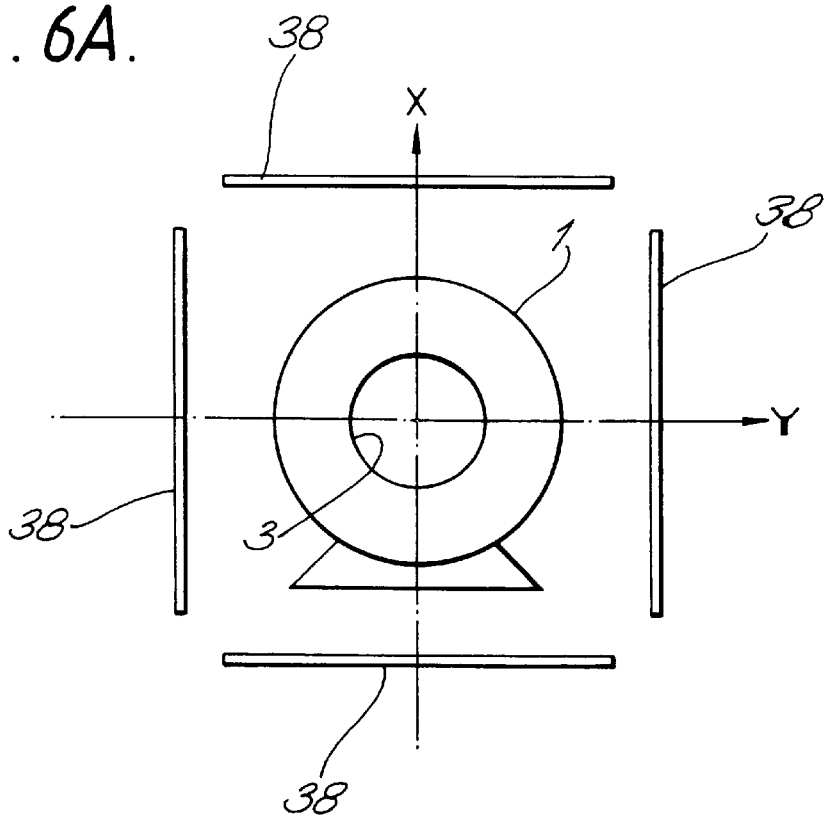
FIGS. 6A and 6B are schematic end and side views of a third example of a magnet assembly; and, FIG. 7 is a block diagram of NMR apparatus incorporating a magnet assembly as shown in FIG. 1.
Figure 6B:
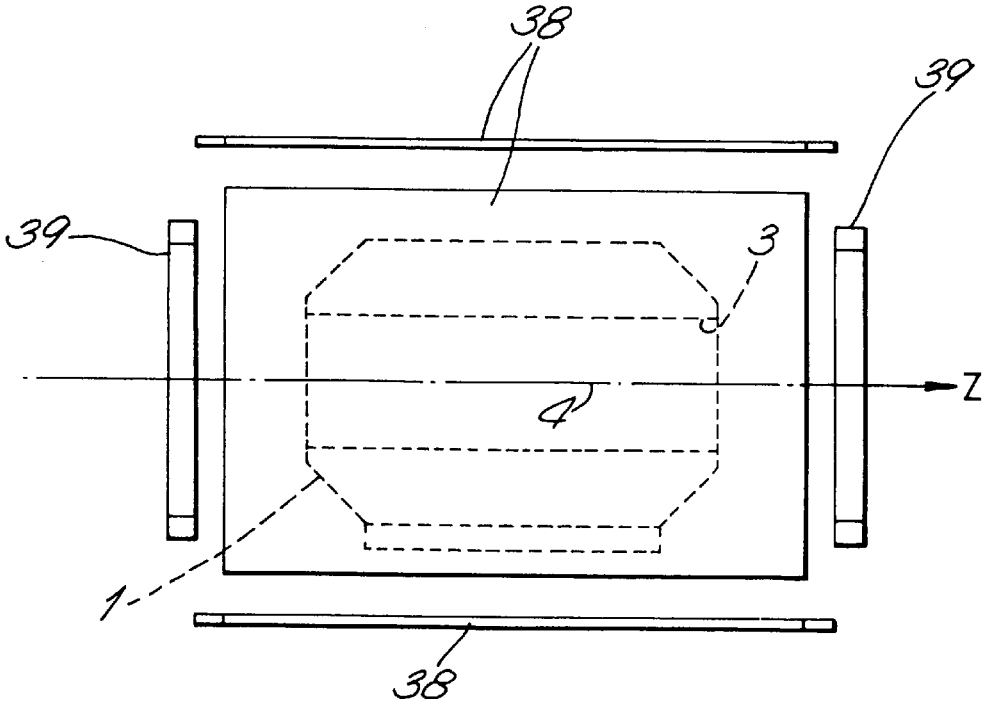

In general, the assembly shown in the previous figures is sufficiently shielded but in some cases it may be desirable to provide some extra shielding. One way in which this may be achieved is illustrated in FIGS. 6A and 6B. In this example, the magnet assembly 1 which is the same as that shown in FIG. 1, is surrounded by four rectangular iron plates 38 positioned parallel with the axis 4. A pair of resistive coils 39 are positioned transversely to the axis 4 at positions spaced from the ends of the bore 3. Typically, each coil 39 will have a diameter of three meters, have 50 turns and be powered from separate power supplies (not shown) by a current of between 100 and 150 A.

This arrangement results in more improved shielding without affecting the bore field significantly. Furthermore, where the magnet assembly is to be used in NMR imaging apparatus the coils 39 do not impede access to the bore 3 for a patient.

An improved form of assembly to that shown in FIGS. 6A and 6B may be obtained by constructing the former 7 from iron. In this way, the iron plates 38 of FIG. 6A are incorporated into the magnet assembly 1 thus producing a very compact construction in which the shielding effect of the coils D–F is considerably enhanced.

Figure 7:
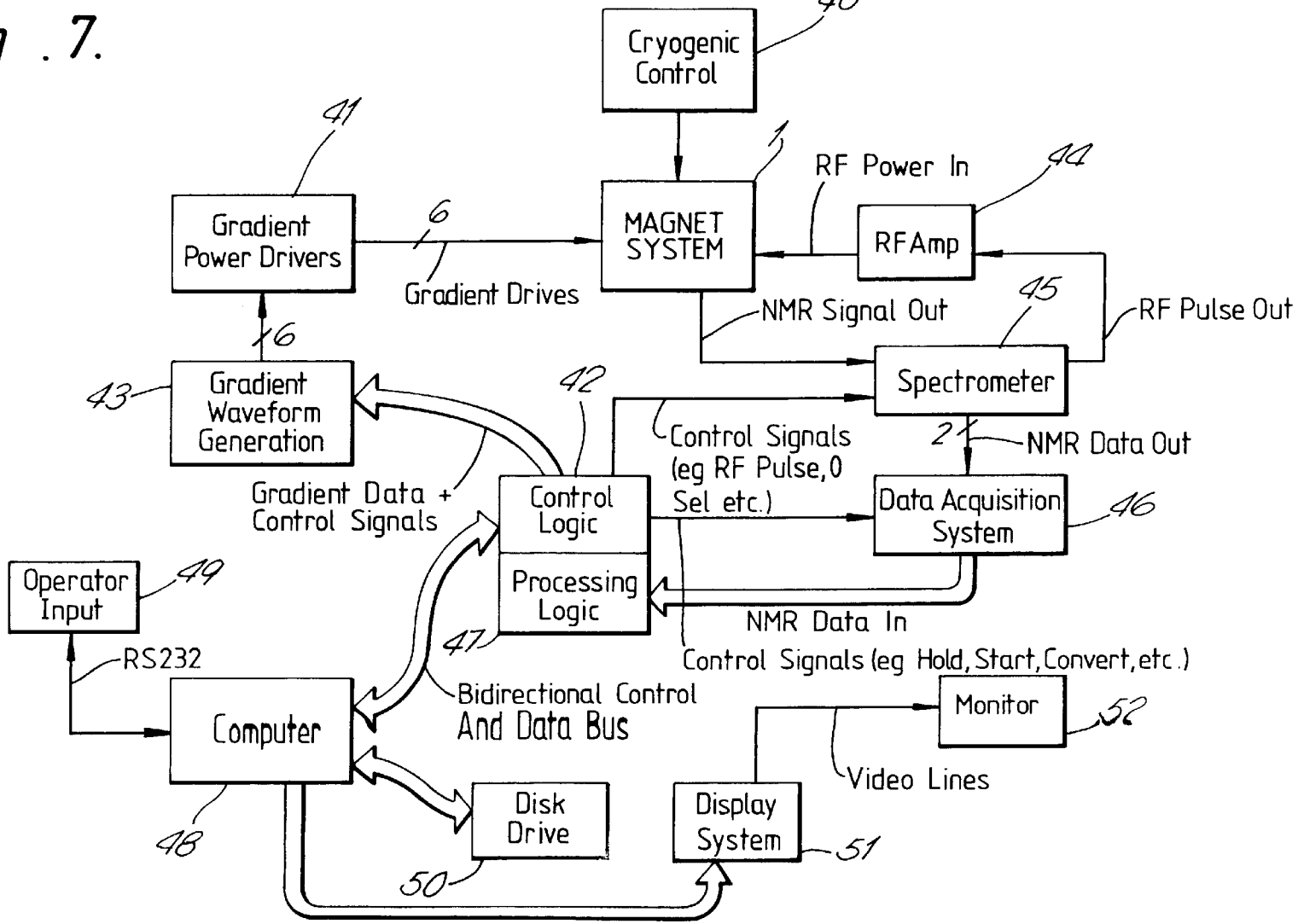

One of the most important applications of the magnet assembly described is in NMR imaging apparatus. FIG. 7 illustrates in block diagram form such apparatus which is otherwise of a conventional form. The apparatus comprises the magnet system 1 incorporating a power supply (not shown). The inlets to the helium can and the space 18 are connected to suitable supplies whose operation is controlled by a cryogenic control system 40 of a conventional type.

The former 2 carries a number of gradient coils so that different gradients of magnetic field can be set up through the bore 3 to enable NMR imaging experiments to be carried out. These gradient coils are not superconducting coils and are also of a conventional form. They are driven by respective power drivers 41 controlled from control logic 42 via a waveform generator 43. Coils (not shown) for generating and receiving RF energy are also mounted on the former 2, the RF transmitter being connected to an amplifier 44 which is connected to a spectrometer 45. The RF receiver which detects the NMR signal is also connected to the spectrometer 45. The generation of RF pulses is controlled by the control logic 42 which is connected to the spectrometer 45. NMR data from the spectrometer 45 passes to a data acquisition system 46 which is controlled by the control logic 42. Data from the system 46 then passes to processing logic logic 47.

The overall control of the system is provided by a computer 48 which is connected via a conventional RS 232 interface to an operator input station 49. Information for the computer is stored in a disc drive 50 while the results of the imaging experiments are passed by the computer to a display system 51 which can display "slices" through the patient's body on a monitor 52.

In use, a patient lies inside the bore 3 extending along the axis 4 of the assembly which is conventionally termed the Z direction.

Table 3 below illustrates typical dimensions of a conventional unshielded magnet assembly and the magnet assembly shown in FIG. 1 for comparison. The figures relate to a 1.5 T bore field with a 1 meter diameter bore.

TABLE 3

| | Axial Length (Meters) | Diameter (Meters) | Height M | Mass $K_g$ |
|---|---|---|---|---|
| Unshielded | 2.1 | 2.2 | 2.8 | 7500 |
| Shielded | 2.3 | 2.3 | 2.9 | 8900 |

We claim:

1. A *nuclear magnetic resonance* magnet assembly comprising a first superconducting *nuclear magnetic resonance* coil assembly *having a first radius,* defining a working volume *for human imaging having radial and axial dimensions* and adapted to generate a first magnetic field in said working volume; and a second superconducting *nuclear magnetic resonance* coil assembly adapted to generate a second magnetic field, said second superconducting coil assembly *having a second radius larger than the first radius and* being electrically connected in series with said first superconducting coil assembly, wherein said first and second superconducting coil assemblies are each adapted to generate magnetic fields whose corresponding components are of substantially the same order of magnitude, said *coil* assemblies being arranged such that a resultant, uniform magnetic field *with a uniformity equal to or better than approximately 400 parts per million* is generated in said working volume *in the radial and axial dimensions, one of said coil assemblies having coils each with an independent position along an axis of the magnet and the coils being positioned as a group to provide the uniform field*, and said second magnetic field opposes said first magnetic field externally of said magnet assembly.

2. [An] *A magnet* assembly according to claim 1, wherein said *magnet* assembly defines a mid-plane, said first superconducting coil assembly comprising a plurality of coaxial coils defining an axis and arranged symmetrically about said mid-plane of said magnet assembly normal to said axis.

3. [An] *A magnet* assembly according to claim 1, wherein said *magnet* assembly defines a mid-plane, said second superconducting coil assembly comprising a plurality of coaxial coils defining an axis and arranged symmetrically about said mid-plane of said magnet assembly normal to said axis.

4. [An] *A magnet* assembly according to claim 1, wherein said *magnet* assembly defines a mid-plane, said first superconducting coil assembly comprising a plurality of coaxial coils defining an axis and arranged symmetrically about said mid-plane of said magnet assembly normal to said axis and said second superconducting coil assembly comprising a plurality of coaxial coils defining an axis and arranged symmetrically about said mid-plane of said magnet assembly normal to said axis, wherein said axes of said coils of said first and second superconducting coil assemblies are coincident.

5. [An] *A magnet* assembly according to claim 1, further comprising a shield of magnetic material arranged around at least said first superconducting coil assembly.

6. [An] *A magnet* assembly according to claim 5, wherein said shield is made of iron.

7. [An] *A magnet* assembly according to claim 5, further comprising a former supporting said second superconducting assembly; said shield being constituted by said former.

8. [An] *A magnet* assembly according to claim 7, wherein said former is made of iron.

9. [An] *A magnet* assembly according to claim 1, wherein said *magnet* working volume defines opposed ends, said assembly further comprising a pair of additional coils positioned adjacent to each of said ends of said working volume and arranged to oppose the resultant magnet field generated by said first and second coil assemblies at these positions.

10. NMR imaging apparatus incorporating a magnet assembly comprising a first superconducting *NMR* coil assembly *having a first radius,* defining a working volume *for human imaging having radial and axial dimensions* and adapted to generate a first magnetic field in said working volume; and a second superconducting *NMR* coil assembly *having a second radius larger than the first radius and* adapted to generate a second magnetic field, said second superconducting coil assembly being electrically connected in series with said first superconducting coil assembly, wherein said first and second superconducting coil assemblies are each adapted to generate magnetic fields whose corresponding components are of substantially the same order of magnitude, said *coil* assemblies being arranged such that a resultant, uniform magnetic field *with a uniformity equal to or better than approximately 400 parts per million* is generated in said working volume, *in the radial and axial dimensions, one of said coil assemblies having coils each with an independent position along an axis of the magnet and the coils being positioned as a group to provide the uniform field* and said second magnetic field opposes said first magnetic field externally of said magnet assembly; a power supply for activating said first and second superconducting coil assemblies; and control means for controlling operation of the apparatus.

*11. A nuclear magnetic resonance magnet assembly defining a mid-plane and comprising a first superconducting nuclear magnetic resonance coil assembly having a first radius, defining a working volume for human imaging having radial and axial dimensions, adapted to generate a first magnetic field in said working volume and comprising a plurality of coaxial coils defining an axis and arranged symmetrically about said mid-plane of said magnet assembly normal to said axis; and a second superconducting nuclear magnetic resonance coil assembly having a second radius larger than the first radius and adapted to generate a second magnetic field, said second superconducting coil assembly being electrically connected in series with said first superconducting coil assembly, wherein said first and second superconducting coil assemblies are each adapted to generate magnetic fields whose corresponding components are of substantially the same order of magnitude, said coil assemblies being arranged surrounding said working volume such that a resultant, uniform magnetic field with a uniformity equal to or better than approximately 400 parts per million is generated in said working volume in the radial and axial dimensions, the coils each having an independent position along the axis of the magnet and the coils being positioned as a group to provide the uniform field, and said second magnetic field opposes said first magnetic field externally of said magnet assembly.*

*12. A nuclear magnetic resonance magnet assembly comprising a first superconducting nuclear magnetic resonance coil assembly having a first radius, defining a working*

*volume for human imaging having radial and axial dimensions and adapted to generate a first magnetic field in said working volume; and a second superconducting nuclear magnetic resonance coil assembly having a second radius larger than the first radius and adapted to generate a second magnetic field, said second superconducting coil assembly being electrically connected in series with said first superconducting coil assembly, wherein said first and second superconducting coil assemblies are each adapted to generate magnetic fields whose corresponding components are of substantially the same order of magnitude, said coil assemblies being arranged concentrically with respect to said working volume such that a resultant, uniform magnetic field with a uniformity equal to or better than approximately 400 parts per million is generated in said working volume in the radial and axial dimensions, one of said coil assemblies having coils each with an independent position along an axis of the magnet and the coils being positioned as a group to provide the uniform field, and said second magnetic field opposes said first magnetic field externally of said magnet assembly.*

*13. A nuclear magnetic resonance magnet assembly comprising a first superconducting nuclear magnetic resonance coil assembly having a first radius, defining a working volume for human imaging having radial and axial dimensions and adapted to generate a first magnetic field in said working volume; and a second superconducting nuclear magnetic resonance coil assembly having a second radius larger than the first radius and adapted to generate a second magnetic field, said second superconducting coil assembly being electrically connected in series with said first superconducting coil assembly, wherein said first and second superconductor coil assemblies are each adapted to generate magnetic fields whose corresponding components are of substantially the same order of magnitude, said coil assemblies being arranged with respect to said working volume such that a resultant, uniform magnetic field with a uniformity equal to or better than approximately 400 parts per million is generated in said working volume in the radial and axial dimensions sufficient for nuclear magnetic resonance, one of said coil assemblies having coils each with an independent position along an axis of the magnet and the coils being positioned as a group to provide the uniform field, and said second magnetic field opposes said first magnetic field externally of said magnet assembly.*

*14. A nuclear magnetic resonance magnet assembly comprising a first superconducting nuclear magnetic resonance coil assembly having a first radius, defining a working volume for human imaging having radial and axial dimensions and adapted to generate a first magnetic field in said working volume; and a second superconducting nuclear magnetic resonance coil assembly having a second radius larger than the first radius and adapted to generate a second magnetic field, said second superconducting coil assembly being electrically connected in series with said first superconducting coil assembly, wherein said first and second superconducting coil assemblies are each adapted to generate magnetic fields whose corresponding components are of substantially the same order of magnitude, said coil assemblies comprising coils defining a mid-plane and an axis in said working volume, and being arranged at radial and axial positions with respect to the axis and at positions with respect to each other as a group to generate a resultant, uniform magnetic field with a uniformity equal to or better than 400 parts per million in said working volume in the radial and axial dimensions, and to generate opposing fields externally of said magnet assembly.*

*15. A nuclear magnetic resonance magnet assembly comprising a first superconducting nuclear magnetic resonance coil assembly having a first radius, defining a working volume for human imaging having radial and axial dimensions and adapted to generate a first uniform, magnetic field in said working volume; and a second superconducting nuclear magnetic resonance coil assembly having a second radius larger than the first radius and adapted to generate a second uniform magnetic field, said second superconducting coil assembly being electrically connected in series with said first superconducting coil assembly, wherein said first and second superconducting coil assemblies are each adapted to generate magnetic fields whose corresponding components are of substantially the same order of magnitude, said coil assemblies being arranged with respect to said working volume such that a resultant, uniform magnetic field with a uniformity equal to or better than approximately 400 parts per million and combining said first and second uniform magnetic fields is generated in said working volume one of said coil assemblies having coils each with an independent position along an axis of the magnet and the coils being positioned as a group to provide the uniform field, and said second magnetic field opposes said first magnetic field externally of said magnet assembly.*

*16. A nuclear magnetic resonance magnet assembly comprising a first superconducting nuclear magnetic resonance coil assembly having a first radius, defining a working volume for human imaging having radial and axial dimensions and adapted to generate a first non-uniform, magnetic field in said working volume; and a second superconducting nuclear magnetic resonance coil assembly having a second radius larger than the first radius and adapted to generate a second non-uniform, magnetic field, said second superconducting coil assembly being electrically connected in series with said first superconducting coil assembly, wherein said first and second superconducting coil assemblies are each adapted to generate magnetic field whose corresponding components are of substantially the same order of magnitude, said coil assemblies being arranged with respect to said working volume such that a resultant, uniform magnetic field, with a uniformity equal to or better than 400 parts per million and combining said first and second non-uniform magnetic fields, is generated in said working volume in the radial and axial dimensions, said coil assemblies comprising coils each having an independent position along an axis of the magnet and the coils being positioned as a group to provide the uniform field and said second magnetic field opposes said first magnetic field externally of said magnet assembly.*

*17. A magnet assembly according to claim 1, 10, 11, 12, 13, 14, 15 or 16, further comprising a protective resistance connected in parallel to said first and second superconducting coil assemblies.*

*18. A nuclear resonance magnet, comprising:*

*a first nuclear magnetic resonance coil assembly defining a working volume for human imaging having radial and axial dimensions, said first assembly having an axis and a first radius and having first coils positioned at independent positions along the axis, the first coils generating a first non-uniform magnetic field having a first magnitude; and*

*a second nuclear magnetic resonance coil assembly having a second radius larger than the first radius, said second assembly electrically connected in series with said first assembly and having coils positioned at independent positions along the axis, the second coils generating a second non-uniform magnetic field opposing the first field and having a second magnitude of*

*substantially the same order as the first magnitude, the first and second coils being positioned at the independent positions producing a resultant uniform field having the radial and axial dimensions of the working volume the uniform field having a uniformity equal to or better than 400 parts per million, and the first coils being positioned at the positions also suppressing the first non-uniform magnetic field externally of the magnet and shielding objects external of the magnet from magnetic influence of the magnet.*

* * * * *

UNITED STATES PATENT AND TRADEMARK OFFICE

CERTIFICATE OF CORRECTION

PATENT NO.: Re. 36,782
DATED : July 18, 2000
INVENTOR(S): Ian J. BROWN, et al.

It is certified that [an/error[s]] appears in the above-identified patent and that said Letters Patent is hereby corrected as shown below:

Column 2, line 43, change "Field" to --field--
Column 11, line 33, change "superconductor" to --superconducting--

Signed and Sealed this

Seventeenth Day of April, 2001

*Attest:*

Nicholas P. Godici

NICHOLAS P. GODICI

*Attesting Officer*

*Acting Director of the United States Patent and Trademark Office*